(12) United States Patent
Jian et al.

(10) Patent No.: US 10,492,309 B2
(45) Date of Patent: Nov. 26, 2019

(54) PRINTED CIRCUIT BOARD AND METHOD FOR MANUFACTURING THE SAME

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Rih-Sin Jian, New Taipei (TW); Xiao-Wei Kang, Shenzhen (CN); LI Yang, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 15/835,817

(22) Filed: Dec. 8, 2017

(65) Prior Publication Data
US 2019/0069417 A1 Feb. 28, 2019

(30) Foreign Application Priority Data
Aug. 24, 2017 (CN) .......................... 2017 1 0735480

(51) Int. Cl.
H05K 1/02 (2006.01)
H05K 1/11 (2006.01)
(Continued)

(52) U.S. Cl.
CPC ........... *H05K 3/4685* (2013.01); *G11B 5/484* (2013.01); *G11B 5/486* (2013.01); *H05K 1/0265* (2013.01);
(Continued)

(58) Field of Classification Search
CPC ...... H05K 3/4685; H05K 1/115; H05K 1/144; H05K 1/056; H05K 1/0298; H05K 3/4611;
(Continued)

(56) References Cited

U.S. PATENT DOCUMENTS 4,685,033 A    8/1987  Inoue
6,000,130 A *  12/1999 Chang ..................... H01L 23/50
                                                    257/E23.079
(Continued)

FOREIGN PATENT DOCUMENTS

CN    104168706 A    11/2014
TW    201509247 A     3/2015

*Primary Examiner* — Ishwarbhai B Patel
(74) *Attorney, Agent, or Firm* — ScienBiziP, P.C.

(57) ABSTRACT

A printed circuit board includes a circuit substrate and a plurality of buffering circuits. The circuit substrate includes a substrate layer, and first and second circuit layers formed on either side of the substrate layer. The first circuit layer comprises a plurality of first conductive circuits. The second circuit layer comprises a plurality of second conductive circuits. A line width of each of the plurality of first conductive circuits is greater than a line width of each of the plurality of second conductive circuits. The plurality of buffering circuits electrically connect the first circuit layer to the second circuit layer and a line width of each of the plurality of buffering circuits is greater than the line width of each of the plurality of second conductive circuits.

7 Claims, 6 Drawing Sheets

(51) Int. Cl.
*H05K 3/46* (2006.01)
*G11B 5/48* (2006.01)
*H05K 1/05* (2006.01)
*H05K 1/14* (2006.01)
*H05K 3/42* (2006.01)

(52) U.S. Cl.
CPC ........... H05K 1/0298 (2013.01); H05K 1/056 (2013.01); H05K 1/112 (2013.01); H05K 1/115 (2013.01); H05K 1/144 (2013.01); H05K 3/427 (2013.01); *H05K 1/0245* (2013.01); *H05K 3/4611* (2013.01); *H05K 2201/0183* (2013.01); *H05K 2201/09563* (2013.01); *H05K 2201/09727* (2013.01); *H05K 2201/09881* (2013.01); *H05K 2203/0323* (2013.01)

(58) Field of Classification Search
CPC ......... H05K 1/0245; H05K 2203/0323; H05K 2201/0183; G11B 5/484; G11B 5/486
See application file for complete search history.

(56) References Cited

U.S. PATENT DOCUMENTS

| | | | | |
|---|---|---|---|---|
| 7,726,016 B2 * | 6/2010 | Ohsumi | ................. | H05K 3/427 |
| | | | | 174/255 |
| 2006/0225917 A1 * | 10/2006 | Hu | ..................... | H05K 1/113 |
| | | | | 174/257 |
| 2007/0263370 A1 * | 11/2007 | Niki | ..................... | H05K 1/115 |
| | | | | 361/783 |
| 2016/0037629 A1 * | 2/2016 | Takahashi | ............ | H05K 1/0296 |
| | | | | 174/257 |
| 2018/0138114 A1 * | 5/2018 | Lee | ................... | H01L 23/49838 |

* cited by examiner

PRINTED CIRCUIT BOARD AND METHOD FOR MANUFACTURING THE SAME

FIELD

The subject matter generally relates to a printed circuit board and method for manufacturing the printed circuit board.

BACKGROUND

A circuit board used in a vehicle headlight comprises a vehicle-mounted battery module and a light-emitting diode. The vehicle-mounted battery module provides a driving current to the light-emitting diode to control the light-emitting diode to emit light. The rated power of the light-emitting diode is small, according to $P=U^2*S/(\rho L)$ (where P represents power, U represents voltage, $\rho$ represents conductor resistivity, and L represents resistance length), and when U, $\rho$, L are invariant, S is smaller. That is, circuit connecting electrically the vehicle-mounted battery module and the light-emitting diode carries fine-scale lines. When a high power current runs through the fine-scale lines a large amount of heat is produced, the heat will damage the light-emitting diode.

BRIEF DESCRIPTION OF THE DRAWINGS

Implementations of the present disclosure will now be described, by way of example only, with reference to the attached figures.

DETAILED DESCRIPTION OF EMBODIMENTS

Figure 1A:
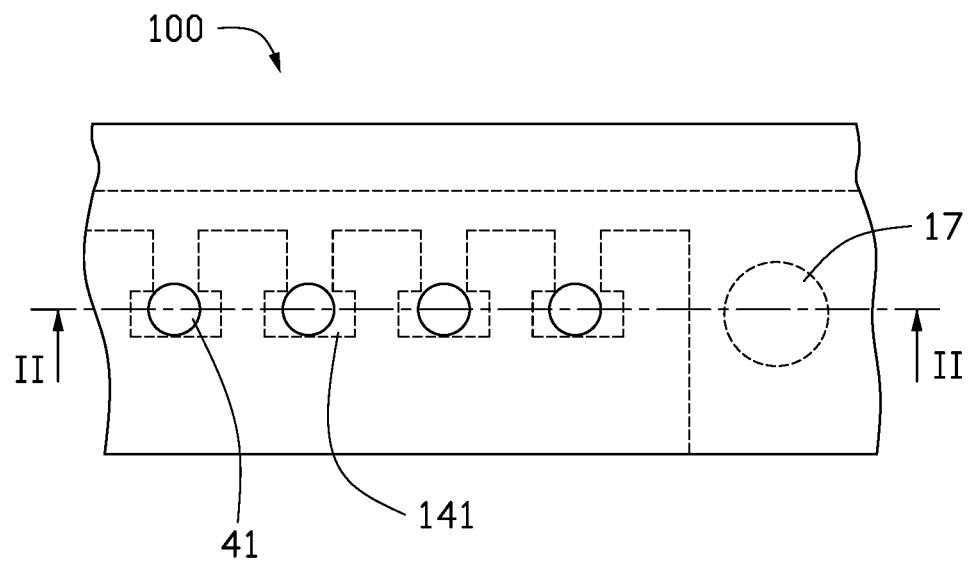
FIG. 1A is a plan view of an exemplary embodiment of a printed circuit board of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one".

The term "comprising" when utilized, means "including, but not necessarily limited to"; it specifically indicates open-ended inclusion or membership in the so-described combination, group, series, and the like.

Figure 1B:
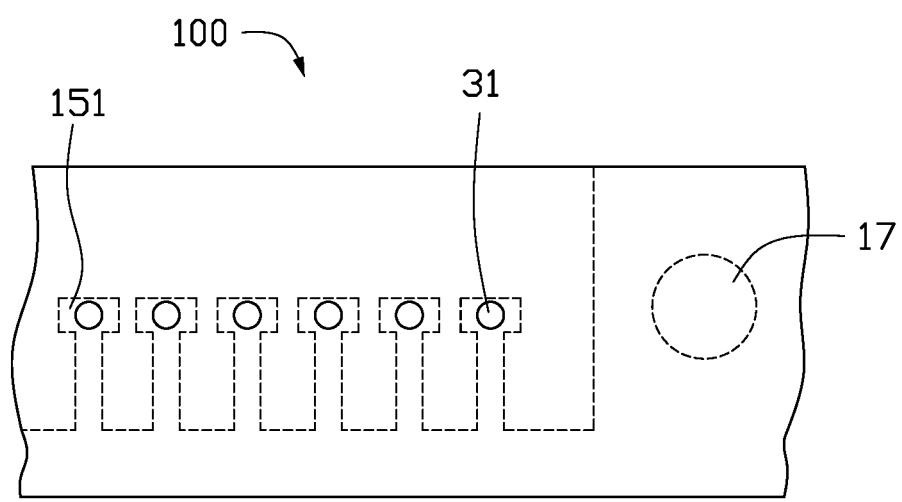
FIG. 1B is a plan view of the printed circuit board of FIG. 1 in another direction.
Figure 2:
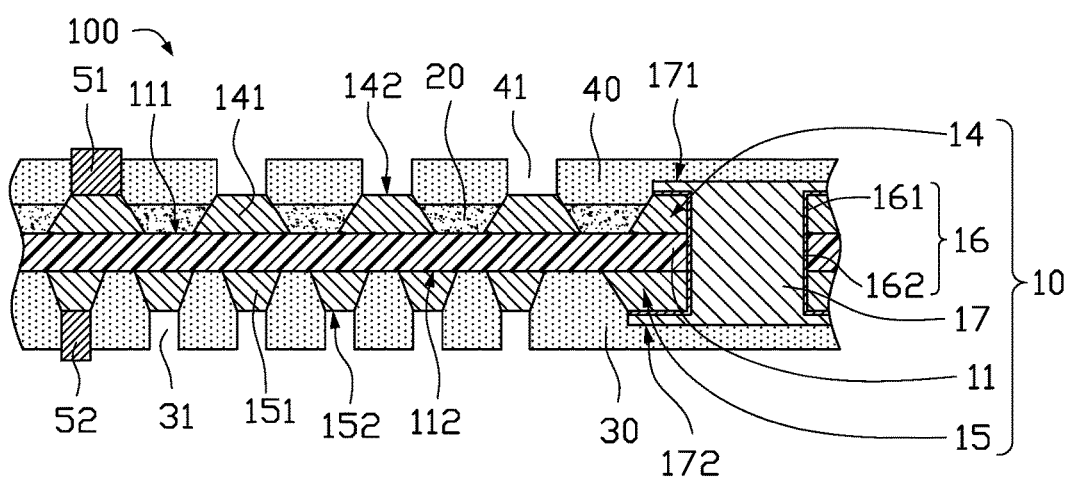
FIG. 2 is a cross-sectional view of the printed circuit board of FIG. 1A.

FIGS. 1A, 1B, and 2 illustrate an exemplary embodiment of a printed circuit board 100. The printed circuit board 100 includes a circuit substrate 10, a plurality of buffering circuits 17, a dielectric layer 20, a first cover layer 40, and a second cover layer 30.

The circuit substrate 10 includes a substrate layer 11, a first circuit layer 14, and a second circuit layer 15.

The substrate layer 11 can be made of one or more insulating material selected from polyimide (PI), polyethylene terephthalate (PET), polyethylene naphthalate (PEN), polyethylene (PE), teflon, liquid crystal polymer (LCP), and polyvinyl chloride polymer (PVC).

In at least one exemplary embodiment, the substrate layer 11 is made of PI.

The substrate layer 11 includes a first surface 111 and a second surface 112 facing away from the first surface 111. The first circuit layer 14 is formed on the first surface 111. The second circuit layer 15 is formed on the second surface 112.

The first circuit layer 14 includes a plurality of first conductive circuits 141. The second circuit layer 15 includes a plurality of second conductive circuits 151.

A line width of each of the first conductive circuits 141 is greater than a line width of each of the second conductive circuits 151. That is, the first conductive circuits 141 have greater line width compared with the second conductive circuits 151.

In at least one exemplary embodiment, the line width of each of the first conductive circuits 141 is three times greater than the line width of each of the second conductive circuits 151.

The circuit substrate 10 also includes a plurality of via holes 16. The plurality of via holes 16 passes through the first circuit layer 14, the substrate 11, and the second circuit layer 15. The plurality of via holes 16 is electrically connected to the first circuit layer 14 and the second circuit layer 15.

The plurality of buffering circuits 17 is formed in the plurality of via holes 16, which electrically connect the first circuit layer 14 to the second circuit layer 15.

The plurality of buffering circuits 17 delivers current from the first conductive circuits 141 to the second conductive circuits 151.

The total number of the plurality of buffering circuits 17 is less than the total number of the plurality of via holes 16.

The plurality of buffering circuits 17 includes a third surface 171 and a fourth surface 172 facing away from the third surface 171. The third surface 171 protrudes from the first circuit layer 14. The fourth surface 172 protrudes from the second circuit layer 15.

In at least one exemplary embodiment, the plurality of buffering circuits 17 covers a portion of the first circuit layer 14 and a portion of the second circuit layer 15.

A line width of each of the plurality of buffering circuits 17 is greater than the line width of each of the second conductive circuits 151. That is, the plurality of buffering circuits 17 has greater line width compared with those of the second conductive circuits 151.

The dielectric layer 20 fills in gaps of the first conductive circuits 141.

A thickness of the dielectric layer 20 is less than a thickness of each of the first conductive circuits 141.

In at least one exemplary embodiment, the dielectric layer 20 is made of adhesive.

Flow-ability of the dielectric layer 20 is greater than flow-ability of adhesive of a common cover film. The flow-ability is the difficulty degree of the adhesive to flow.

The first cover layer 40 covers the first circuit layer 14 and the dielectric layer 20.

The first cover layer 40 includes a plurality of first openings 41. A portion of the plurality of first conductive circuits 141 is exposed from the first openings 41 to form a plurality of connecting terminals 142. The plurality of connecting terminals 142 is electrically connected to first electronic components 51.

In at least one exemplary embodiment, the first electronic components 51 are vehicle-mounted battery modules.

Since the line width of each of the plurality of first conductive lines 141 is larger than the line width of each of the plurality of second conductive lines 151, the gaps of the plurality of first conductive circuits 141 are wider than the gaps of the plurality of second conductive circuits 151. Thus, the first cover layer 40 may not completely fill in the gaps of the plurality of first conductive circuits 141 when the first cover layer 40 covers the plurality of first circuit layer 14. However, the dielectric layer 20 and the first cover layer 40 cooperatively and completely fill in the gaps of the plurality of first conductive circuits 141.

The second cover layer 30 covers the second circuit layer 15.

The second cover layer 30 includes a plurality of second openings 31. A portion of the second conductive circuits 151 is exposed from the plurality of second openings 31 to form a plurality of electrical contact pads 152. The plurality of electrical contact pads 152 is electrically connected to second electronic components 52.

The power consumption or output of the first electronic components 51 is greater than that of the second electronic components 52.

In at least one exemplary embodiment, the second electronic components 52 are light emitting diodes.

The first electronic components 51 are used to provide electrical power to the second electronic components 52 and drive the second electronic components 52 to work.

Figure 3:
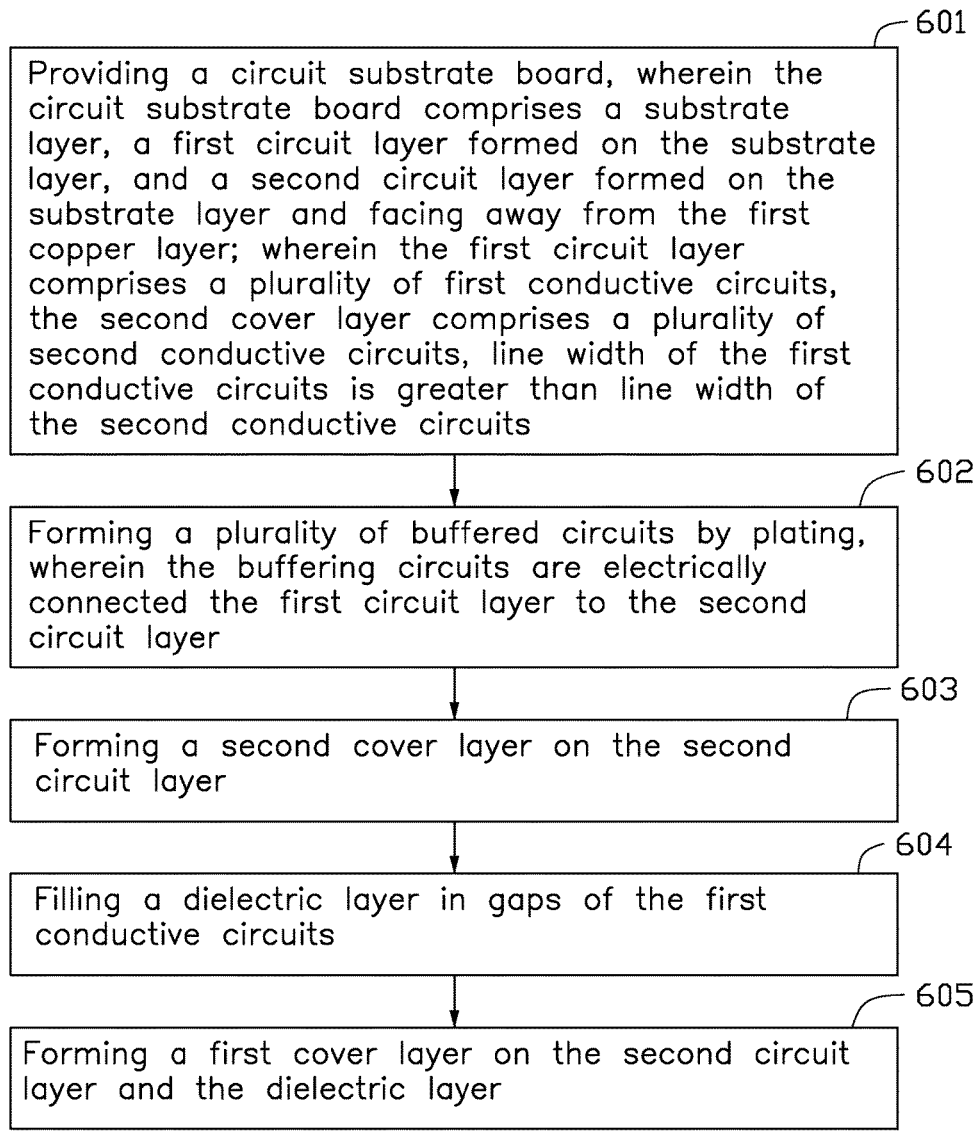
FIG. 3 is a flowchart of an exemplary embodiment of a method for manufacturing the printed circuit board of FIG. 2.

FIG. 3 illustrates a flowchart of a method for manufacturing a printed circuit board 100.

The method is provided by way of example, as there are a variety of ways to carry out the method. The method described below can be carried out using the configurations illustrated in FIG. 1, for example, and various elements of these figures are referenced in explaining example method. Each block shown in FIG. 2 represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method can begin at block 601.

Figure 4:
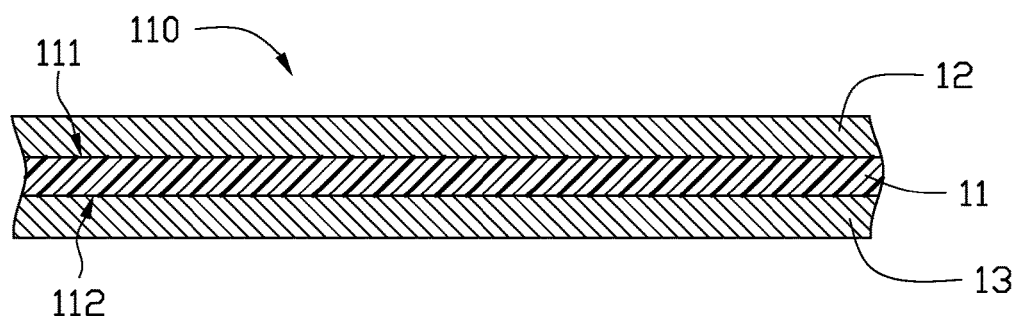
FIG. 4 is a cross-sectional view of a copper clad laminate used in the method of FIG. 3.
Figure 5:
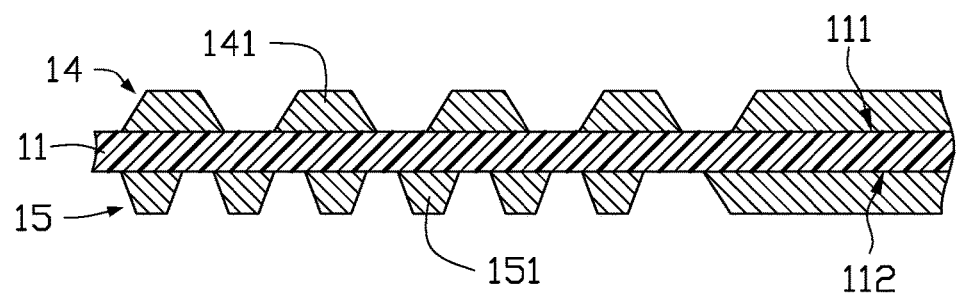
FIG. 5 is a cross-sectional view showing the copper clad laminate of FIG. 4 etched to form a first circuit layer and a second circuit layer.
Figure 6:
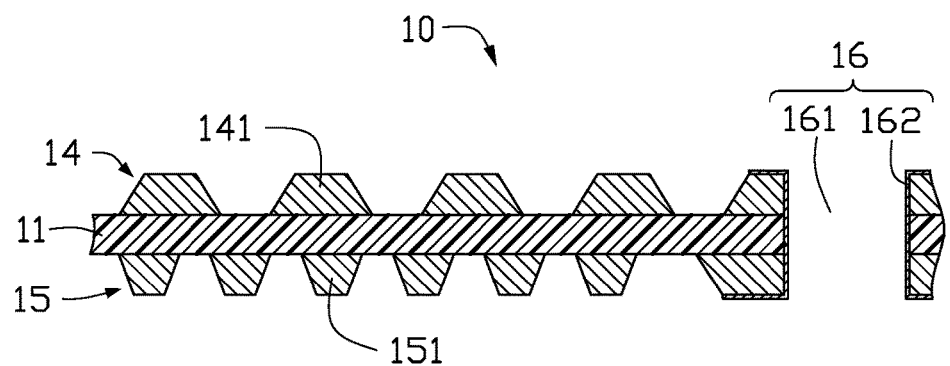
FIG. 6 is a cross-sectional view of a plurality of via holes formed in the copper clad laminate of FIG. 5.

At block 601, also illustrated by FIGS. 4-6, a circuit substrate 10 is provided. The circuit substrate 10 includes a substrate layer 11, a first circuit layer 14, a second circuit layer 15, and a plurality of via holes 16.

The substrate layer 11 can be made of one or more insulating materials selected from polyimide (PI), polyethylene terephthalate (PET), polyethylene naphthalate (PEN), polyethylene (PE), teflon, liquid crystal polymer (LCP), and polyvinyl chloride polymer (PVC).

In at least one exemplary embodiment, the substrate layer 11 is made of PI.

The substrate layer 11 includes a first surface 111 and a second surface 112 facing away from the first surface 111. The first circuit layer 14 is formed on the first surface 111. The second circuit layer 15 is formed on the second surface 112.

The first circuit layer 14 and the second circuit layer 15 are both formed by process of image transfer and etching.

The first circuit layer 14 includes a plurality of first conductive circuits 141. The second circuit layer 15 includes a plurality of second conductive circuits 151.

A line width of each of the plurality of first conductive circuits 141 is greater than a line width of each of the plurality of second conductive circuits 151. That is, the plurality of first conductive circuits 141 has greater line width compared with those of the plurality of second conductive circuits 151.

In at least one exemplary embodiment, the line width of each of the plurality of first conductive circuits 141 is three times greater than the line width of each of the plurality of second conductive circuits 151.

The plurality of via holes 16 passes through the first circuit layer 14, the substrate 11, and the second circuit layer 15.

The plurality of via holes 16 is electrically connected to the first circuit layer 14 and the second circuit layer 15. Diameter of each of the plurality of through holes 16 is greater than the line width of each of the plurality of second conductive circuits 151.

In at least one exemplary embodiment, the circuit substrate 10 can be manufactured by following steps:

First, also illustrated by FIG. 4, a copper clad laminate 110 is provided. The copper clad laminate 110 includes a substrate layer 11, a first copper layer 12, and a second copper layer 13. The substrate 11 includes a first surface 111 and a second surface 112 facing away from the first surface 111. The first copper layer 12 is formed on the first surface 111. The second copper layer 13 is formed on the second surface 112. In at least one exemplary embodiment, a thicknesses of the first copper layer 12 and the second copper layer 13 are both 1 oz.

Second, also illustrated by FIG. 5, the first circuit layer 14 is formed on the first surface 111 by etching the first copper layer 12, and the second circuit layer 15 is formed on the second surface 112 by etching the second copper layer 13.

Third, also illustrated by FIG. 6, a plurality of via holes 16 is formed which passes through the first circuit layer 14, the substrate 11, and the second circuit layer 15, thereby forming the circuit substrate 10.

The plurality of via holes 16 can be formed by the following steps. A plurality of through holes 161 is defined by mechanical punching or laser etching. Electrically conductive material 162 is filled in the plurality of through holes 161 by plating or sputtering to form the plurality of via holes 16.

Figure 7:
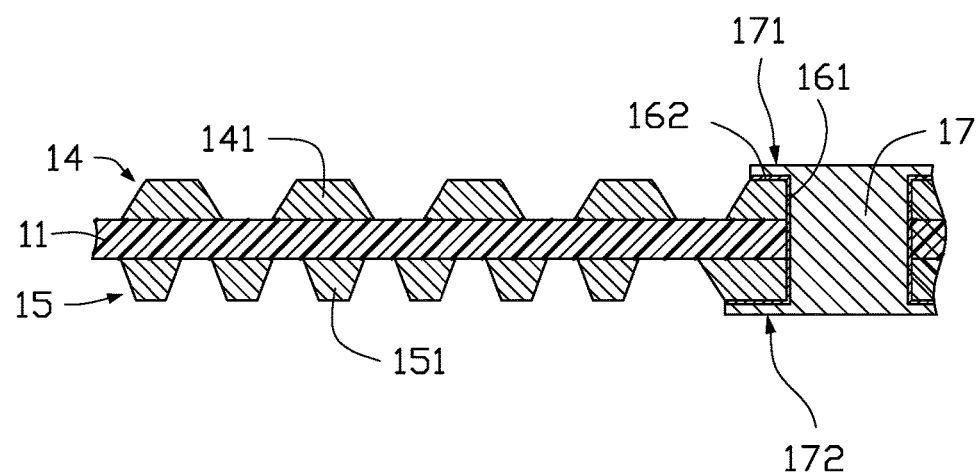
FIG. 7 is a cross-sectional view of a buffering circuit formed in the plurality of via hole of FIG. 6.

At block 602, also illustrated by FIG. 7, a plurality of buffering circuits 17 is formed in one or more of the plurality of via holes 16 by plating.

The plurality of buffering circuits 17 is formed in at least one of the plurality of via holes 16.

The plurality of buffering circuits 17 is used to deliver current from the plurality of first conductive circuits 141 to the plurality of second conductive circuits 151.

The total number of the plurality of buffering circuits 17 is less than the total number of the plurality of via holes 16 in the circuit substrate 10.

The plurality of buffering circuits 17 electrically connects the first circuit layer 14 to the second circuit layer 15.

The plurality of buffering circuits 17 includes a third surface 171 and a fourth surface 172 facing away from the third surface 171. The third surface 171 protrudes from the first circuit layer 14. The fourth surface 172 protrudes from the second circuit layer 15.

In at least one exemplary embodiment, the plurality of buffering circuits 17 covers a portion of the first circuit layer 14 and a portion of the second circuit layer 15.

A line width of each of the plurality of buffering circuits 17 is greater than the line width of each of the plurality of second conductive circuits 151. That is, the plurality of buffering circuits 17 has greater line width compared with the plurality of second conductive circuits 151.

Figure 8:
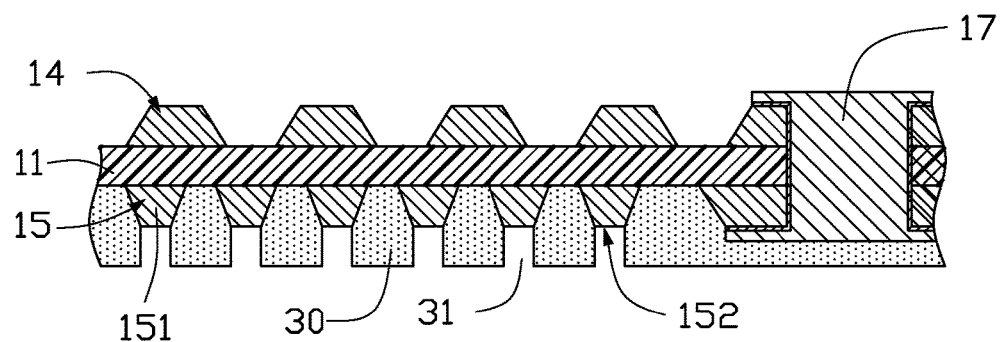
FIG. 8 is a cross-sectional view of a second cover layer formed on the second circuit layer of FIG. 5.

At block 603, also illustrated by FIG. 8, a second cover layer 30 is formed on the second circuit layer 15.

The second cover layer 30 includes a plurality of second openings 31. A portion of the plurality of second conductive circuits 151 is exposed from the plurality of second openings 31 to form a plurality of electrical contact pads 152.

Figure 9:
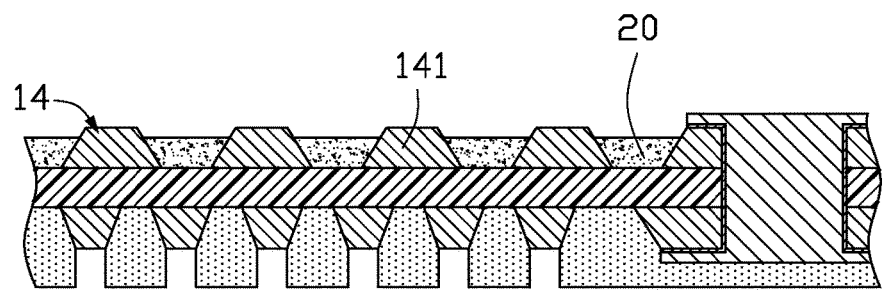
FIG. 9 is a cross-sectional view of a dielectric layer formed in gaps of the first circuit layer of FIG. 5.

At block 604, also illustrated by FIG. 9, a dielectric layer 20 fills in gaps of the plurality of first conductive circuits 141.

A thickness of the dielectric layer 20 is less than a thickness of each of the plurality of first conductive circuits 141.

In at least one exemplary embodiment, the dielectric layer 20 is made of adhesive.

Flow-ability of the dielectric layer 20 is greater than flow-ability of adhesive of a common cover film.

At block 605, also illustrated by FIG. 2, a first cover layer 40 is formed on the first circuit layer 14 and the dielectric layer 20, and at least one first electronic component 51 and at least one second electronic component 52 are provided.

The first cover layer 40 includes a plurality of first openings 41. A portion of the plurality of first conductive circuits 141 is exposed from the plurality of first openings 41 to form a plurality of connecting terminals 142. The plurality of connecting terminals 142 are electrically connected to the first electronic components 51. The power consumption or output of the first electronic components 51 is greater than that of the second electronic components 52.

In at least one exemplary embodiment, the first electronic components 51 are vehicle-mounted battery modules.

In at least one exemplary embodiment, the second electronic components 52 are light emitting diodes.

Since the line width of each of the plurality of first conductive lines 141 is larger than the line width of each of the plurality of second conductive lines 151, the gaps of the plurality of first conductive circuits 141 are wider than the gaps of the plurality of second conductive circuits 151. Thus, the first cover layer 40 may not completely fill in the gaps of the plurality of first conductive circuits 141 when the first cover layer 40 covers the plurality of first circuit layer 14. However, the dielectric layer 20 and the first cover layer 40 cooperatively and completely fill in the gaps of the plurality of first conductive circuits 141.

With the above configuration, the plurality of buffering circuits 17 is electrically connected to the plurality of first conductive circuits 141 and the plurality of second conductive circuits 151. The plurality of buffering circuits 17 has a greater line width than the line width of each of the plurality of second conductive circuits 151. Thus, when a high current from first electronic components 51 runs through the plurality of first conductive circuits 141 and the plurality of buffering circuits 17, a high current may be absorbed or sunk. Thus, the printed circuit board 100 can prevent high current from harming the plurality of second conductive circuits 151, which has delicate and fine lines and the second electronic components 52.

The embodiments shown and described above are only examples. Many details are often found in the art such as the other features of the printed circuit board having the same. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A printed circuit board comprising:
    a circuit substrate, the circuit substrate comprising:
        a substrate layer;
        a first circuit layer, wherein the first circuit layer is formed on the substrate layer, the first circuit layer comprises a plurality of first conductive circuits;
        a second circuit layer formed on the substrate layer and facing away from the first circuit layer, wherein the second circuit layer comprises a plurality of second conductive circuits; wherein a line width of each of the plurality of first conductive circuits is greater than a line width of each of the plurality of second conductive circuits;
    a plurality of buffering circuits; wherein the buffering circuits electrically connect the first circuit layer to the second circuit layer, the buffering circuits cover a portion of the first circuit layer and a portion of the second circuit layer;
    wherein a line width of each of the plurality of buffering circuits is greater than the line width of each of the plurality of second conductive circuits; and
    a dielectric layer, the dielectric layer filling in gaps of the plurality of first conductive circuits, wherein a thickness of the dielectric layer is less than a thickness of each of the plurality of first conductive circuits.

2. The printed circuit board of claim 1, wherein the line width of each of the plurality of first conductive circuits is three times greater than the line width of each of the plurality of second conductive circuits.

3. The printed circuit board of claim 1, wherein the circuit substrate further comprises a plurality of via holes, the plurality of via holes passes through the first circuit layer, the substrate, and the second circuit layer; and the plurality of buffering circuits is formed in the via holes.

4. The printed circuit board of claim 1, wherein the dielectric layer is made of adhesive.

5. The printed circuit board of claim 1, wherein flow-ability of the dielectric layer is greater than flow-ability of adhesive of a common cover film.

6. The printed circuit board of claim 1, wherein the printed circuit board further comprises first electronic components and second electronic components, the first electronic components are electrically connected to the plurality of first conductive circuits, the second electronic components are electrically connected to the plurality of second conductive circuits.

7. The printed circuit board of claim 6, wherein the power consumption or output of the first electronic components is greater than the power consumption or output of the second electronic components.

\* \* \* \* \*